United States Patent [19]

Thulke

[11] Patent Number: 5,208,878
[45] Date of Patent: May 4, 1993

[54] MONOLITHICALLY INTEGRATED LASER-DIODE-WAVEGUIDE COMBINATION

[75] Inventor: Wolfgang Thulke, Munich, Fed. Rep. of Germany

[73] Assignee: Siemens Aktiengesellschaft, Munich, Fed. Rep. of Germany

[21] Appl. No.: 769,972

[22] Filed: Oct. 2, 1991

[30] Foreign Application Priority Data

Nov. 28, 1990 [DE] Fed. Rep. of Germany ....... 4037896

[51] Int. Cl.$^5$ .............................. G02B 6/00; H01S 3/19
[52] U.S. Cl. .......................................... 385/14; 372/45; 372/46; 372/50; 372/96; 357/17
[58] Field of Search ..................... 385/14; 372/45, 46, 372/50, 96; 357/17

[56] References Cited

U.S. PATENT DOCUMENTS

| | | | |
|---|---|---|---|
| 4,352,116 | 9/1982 | Yariv et al. | 357/17 |
| 4,815,090 | 3/1989 | Usami et al. | 372/50 |
| 4,894,833 | 1/1990 | Carlin | 372/50 X |
| 4,899,361 | 2/1990 | Numai | 372/50 |
| 5,084,894 | 1/1992 | Yamamoto | 372/50 |

OTHER PUBLICATIONS

Applied Physics Letters, vol. 54, No. 2, Jan. 9, 1989, pp. 114–116; K. Y. Liou et al "Monolithic Integrated In-GaAsP/InP Distributed Feedback Laser with Y-- Branching Waveguide and a Monitoring Photodetector Grown by Metalorganic Chemical Vapor Deposition". Journal of Lightwave Technology, vol. LT-4, No. 7, Jul., 1986, "Monolithically Integrated High-Speed Light Source Using 1.3-$\mu$m Wavelength DFB-D-C-PBH Laser", by Kenichi Kasahara et al, pp. 908–912.
Electronics Letters, Apr. 14, 1988, vol. 24, No. 8, "High-Speed Operation of 1.5 $\mu$m GaInAsP/InP Optoelectronic Integrated Lsser Drivers", pp. 467–468.
IEE Proceedings, vol. 136, Pt. J, No. 1, Feb., 1989, "Design and Fabrication of 1.3 $\mu$m Buried Ridge Stripe Lasers on Semi-Insulating InP Substrate", P. Devoldere et al, pp. 76–82.
IEE Proceedings, vol. 137, Pt. J, No. 1, Feb., 1990, "Modified 1.3 $\mu$m Buried Ridge Stripe Laser For Implanted-FET Integration", F. Delorme et al, pp. 39–42.
IEE Proceedings, vol. 137, Pt. J, No. 1, Feb., 1990, "Fabrication and Lasing Characteristics of $\lambda = 1.56$ $\mu$m Tunable Twin-Guide (TTG) DFB Lasers", by C. F. J. Schanen et al, pp. 69–73.
Electronics Letters; Mar. 29, 1990, vol. 26, No. 7, "New Laser Structure On Semi-Insulating Substrate, Grown By MOCVD, For High Speed Operation", pp. 458–459.
Electronics Letters, Jun. 21, 1990, vol. 26, No. 13, "1–53 $\mu$m DFB Laser On Semi-Insulating InP Substrate With Very Low Threshold Current", pp. 933–934.

Primary Examiner—Akm E. Ullah
Attorney, Agent, or Firm—Hill, Steadman & Simpson

[57] ABSTRACT

A monolithically integrated laser diode waveguide combination on a semi-insulating substrate has in an active region thereof a laser diode with a waveguide layer, an intermediate layer, an active layer, and a grating layer arranged between portions of a lower cover layer. Above this laser strip, an upper cover layer with a central contact layer is located thereupon together with a central contact. An activation of the active layer occurs via the lower cover layer, a lateral contact layer applied on the coating layer, and lateral contacts.

6 Claims, 9 Drawing Sheets

MONOLITHICALLY INTEGRATED LASER-DIODE-WAVEGUIDE COMBINATION

BACKGROUND OF THE INVENTION

The present invention is directed to a monolithically integrated laser-diode-waveguide combination.

A monolithically integrated combination of a laser diode and a passive waveguide coupled therewith is so far only being manufactured on a conductive substrate. A contact provided for the current supply is attached on the bottom side of the substrate. In Electronics Letters 26, 933–934 (1990), incorporated herein, a laser diode on a semi-insulating substrate with a planar surface is described. There, a strip-shaped active layer is arranged between a p-doped layer, which is contacted from the upper side of the component via a p-diffused region, and an n-doped layer, into which current can be sent laterally via n-doped semiconductor material. This lateral, n-doped semiconductor material is contacted laterally of the active strip on the surface of the component, this component being planar.

In Electronics Letters 26, 458–459 (1990), incorporated herein, a laser diode on a semi-insulating substrate is described, whereby an active strip proceeds on an n-doped InP-layer longitudinally to the edge. Laterally of this active strip, an n-contact is located on this InP-layer. Above the active strip and on the surface not covered by this InP-layer, a p-doped contact layer is grown having a p-contact located thereon.

In IEE Proceedings 137, 39–42 (1990), incorporated herein, a laser diode on a semi-insulating substrate is described, whereby an active strip is located on an n-doped layer composed of InP, and embedded laterally in a p-doped InP-layer from the top. Located thereupon is a highly p-conductively doped contact layer and thereupon a p-contact. The lower n-doped InP-layer is laterally provided with an n-contact. A similar structure is described in IEE Proceedings 136, 76–82 (1989), incorporated herein.

In Electronic Letters 24, 467–468 (1988), incorporated herein, and in Journal of Lightwave Technology LT-4, 908–912 (1986), incorporated herein, laser diodes with an integrated field effect transistor on a semi-insulating layer are described.

In IEE Proceedings 137, 69073 (1990), incorporated herein, a tunable DFB-laser is described whereby an active layer and an adjustment/tuning layer are arranged vertically, and the current supply to both layers occurs via a layer which is located centrally in between the two layers and also via the laterally present semiconductor material. The contacts are arranged on a three-layered strip-shaped layer on the lateral semiconductor material, on a contact layer of a different composition above the strip-shaped active region, and on the bottom side of the conductive substrate.

SUMMARY OF THE INVENTION

It is an object of the present invention to specify a monolithically integrated laser-diode-waveguide combination on a semi-insulating substrate.

This problem is solved with the laser-diode-waveguide system of the invention wherein a semi-insulating substrate is provided, and wherein a passive waveguide layer coupled with a strip-shaped active layer of a laser diode is provided adjacent a main surface of the substrate. A strip-shaped upper cover layer of first conductivity type is provided at a side of the active layer not facing the substrate with a central contact layer applied thereon. A strip-shaped intermediate layer of second conductivity type is provided at a side of the active layer facing the substrate and which is defined by two main surfaces parallel to the main surface of the substrate and two longitudinal sides and two narrow end sides. A lower cover layer bordering the two longitudinal sides of the intermediate layer is provided at a region of the laser diode and which is doped as a second conductivity type at least at one longitudinal side of the intermediate layer. A lateral contact layer is applied on the lower covering layer. A central contact layer is applied on the central contact layer and a lateral contact layer is applied on the lateral contact layer.

According to the invention, the integration of the waveguide with the laser diode on a semi-insulating substrate occurs in that the active zone of the laser diode is encased on the sides by a doped cover layer establishing the electrical connection to contacts on the upper side of the component. Semiconductor material which is doped for the opposite conductivity type is located above and along the active layer as an upper cover layer in the shape of a ridge. At its base, this ridge formed by the upper cover layer is not much wider than the active layer. On the ridge, the metallization of the other contact is applied and guided to a bonding area via a narrow strip. This bonding area is arranged on the passive section, i.e. where the optical waveguide is located. A particularly advantageous embodiment of the inventive structure provides that the optical feedback of the laser light in the laser diode occurs through a DFB-grating. This DFB-grating can lie above or below the active layer. The inventive laser-diode-waveguide combination can be manufactured with all known epitaxial methods. Particularly suitable therefor are the popular gas phase methods MOVPE or MOMBE.

DESCRIPTION OF THE PREFERRED EMBODIMENTS

Figure 1:
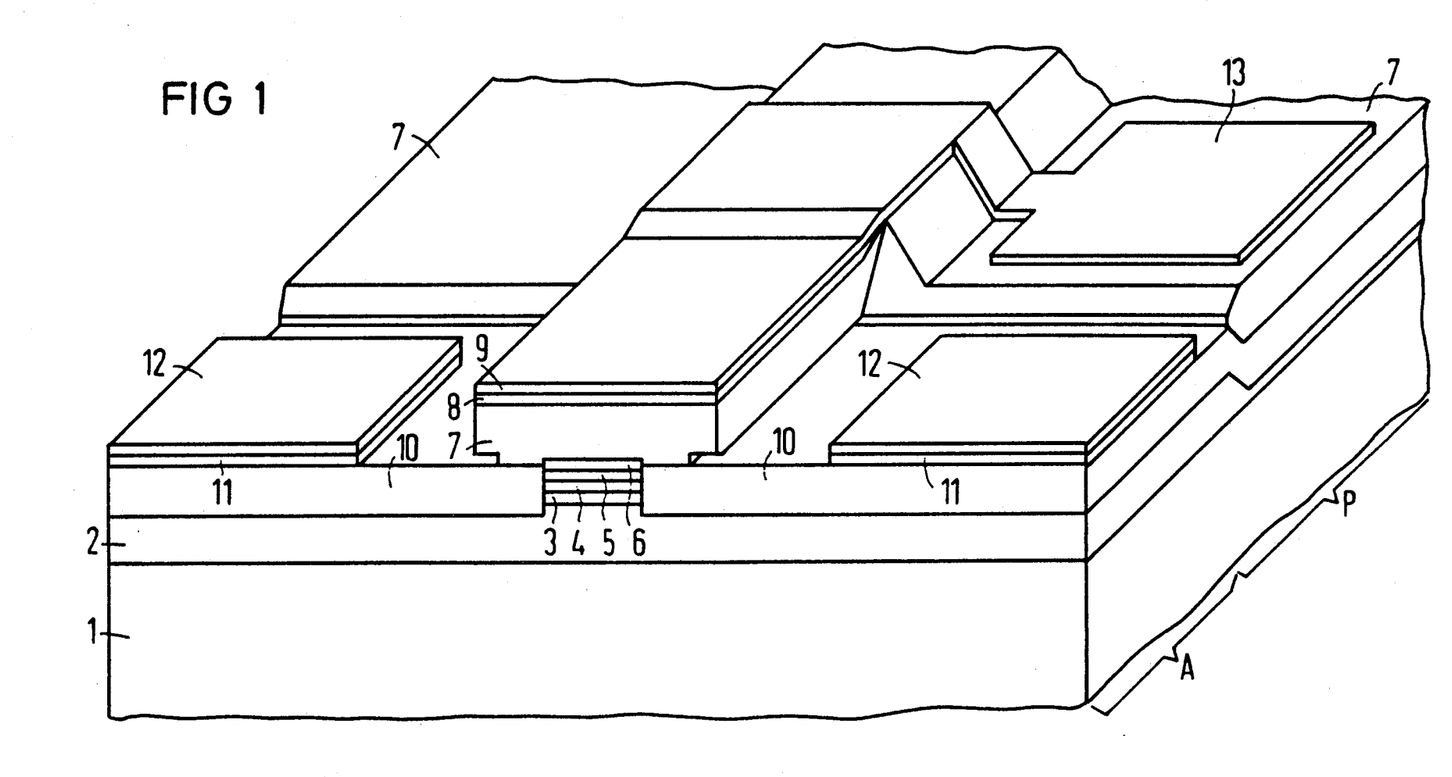
FIG. 1 shows a perspective sectional view of the finished laser-diode-waveguide combination of the invention.

On a substrate 1, FIG. 1 shows a buffer layer 2, and arranged thereupon in strip-shaped fashion above one another a waveguide layer 3, an intermediate layer 4, an active layer 5, and a grating layer 6, with the ridge or strip of the upper cover layer 7 located thereupon on which a central contact layer 8 with the central contact 9 is applied. This central contact 9 is electrically connected laterally with the bonding area 13. Laterally of the strip comprising the active layer 5, the lower cover layer 10 is applied on the buffer layer 2. Located thereupon is the lateral contact layer 11 with the lateral contact 12 located thereupon. The materials of the upper cover layer 7 and the lower cover layer 10 are doped in opposite fashion to each other. Following the active region A is the passive region P with the waveguide. In this passive region P, the upper cover layer 7 is also grown laterally of the central ridge. The lower cover layer 10 is located in the passive region P also above the strip-shaped waveguide (the extension of the waveguide layer 3 in FIG. 1).

Figure 2:
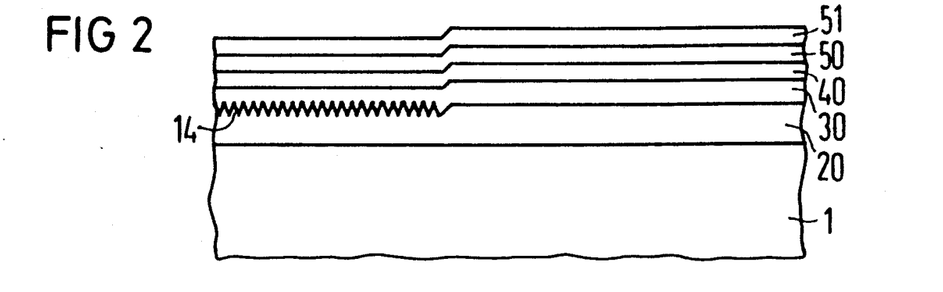
FIGS. 2–9 and 11–25 show cross-sections or longitudinal sections of the structure according to the invention after various manufacturing steps.

The structure that cannot be completely recognized in FIG. 1 is described in the following, for the example of a BH-waveguide, with reference to the manufacturing method. FIG. 2, in longitudinal section, shows the semi-insulating substrate 1 with the buffer layer 20 grown thereon (which can also be left out), with the intermediate layer 40, the active layer 50, and a protective layer 51 grown thereon. At the border between the buffer layer 20 or the covered top side of the substrate and the subsequent waveguide layer 30, a grating 14 is located in the active region. The substrate 1 can be InP:Fe, for example, and the buffer layer 20 InP. The buffer layer 20 can be undoped or e.g. n-doped. The grating must be manufactured in locally limited fashion since it is only necessary in the active region of the laser diode and would lead to radiation losses in the passive region. The waveguide layer is undoped or e.g. $n^-$-doped, and e.g. InGaAsP, and of the wavelength 1.3 $\mu$m. The intermediate layer 40 is e.g. $n^+$-doped and e.g. InP:Sn. The active layer 50 is undoped and e.g. InGaAsP of the wavelength 1.55 $\mu$m. The protective layer 51 is e.g. p-doped and InP:Zn.

Figure 3:
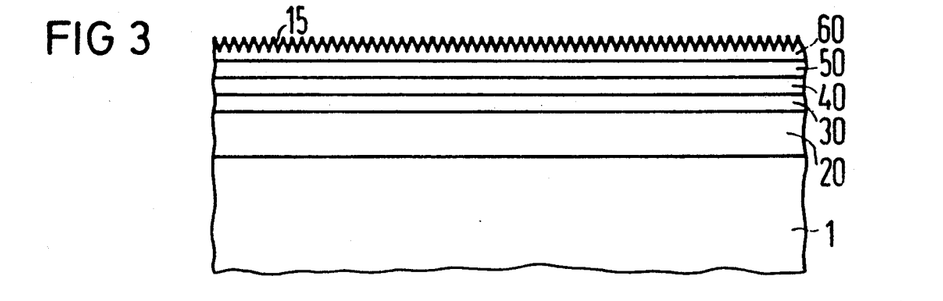

A different embodiment corresponding to FIG. 3 provides the arrangement of the grating 15 above the active layer 50. The uppermost layer as grating layer 60 is composed of material with a higher refractive index than the protective layer 51 in FIG. 2. This grating layer 60 can be e.g. InGaAsP of the wavelength 1.15 $\mu$m. Into this grating layer 60, the DFB-grid is etched on the entire surface. The following is a description of the further manufacturing steps and structure variants for this embodiment according to FIG. 3, with the grating arranged on the top, since this variation represents the simpler solution for the stated object from the manufacturing-oriented point of view.

Figure 4:
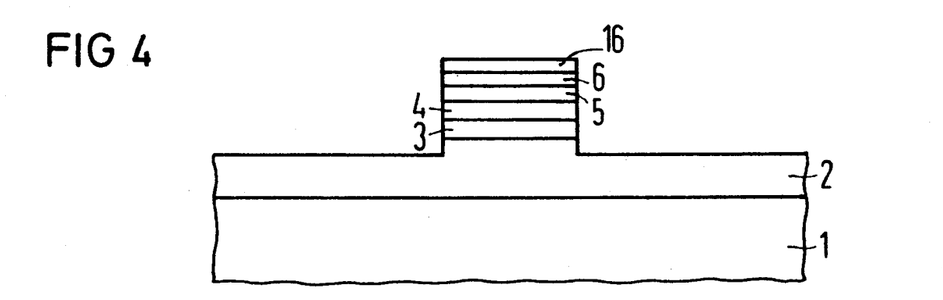

As the next step, the waveguide-layer 30 is exposed in the passive region, which can occur by conventional photolithography and selective wet-chemical etching. The waveguide layer 30 thereby serves as an etching-stop layer. The BH-ridge or strip in the active region is shown in FIG. 4 in cross-section. In the manufacturing process, a strip-shaped mask 16 (e.g. SiO$_2$) is applied on the surface of the grating layer 60. This mask 16 is used for the etching of the layer sequence down to the buffer layer 2, or if the buffer layer is missing, down to the substrate 1. Subsequently, this mask 16 is removed in the passive region. On the grating in the grating layer 6 it at first remains.

Figure 5:
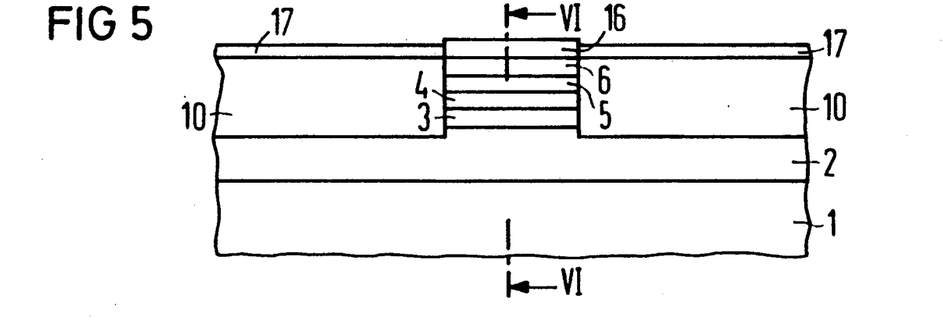
Figure 6:
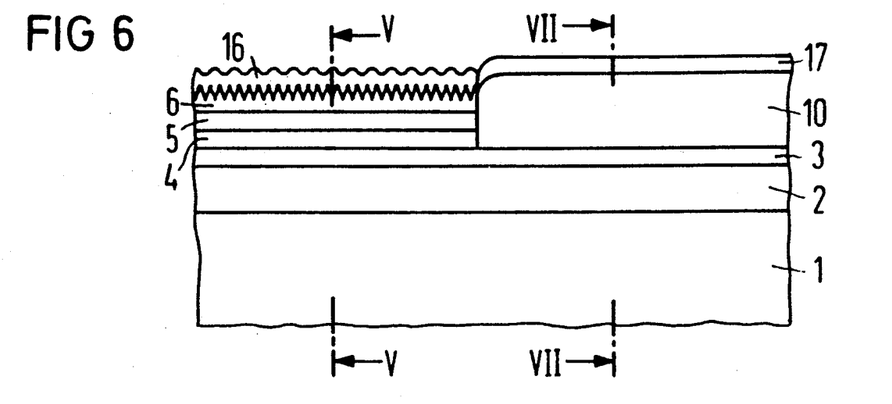
Figure 7:
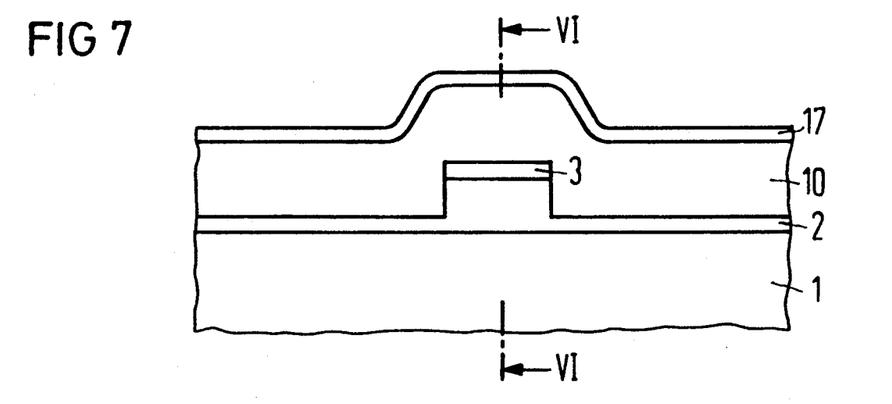

In a subsequent epitaxial step, the sides of the laser ridge or strip are covered with a lower cover layer 10 (e.g. n-doped InP:Zn). In the passive region, this bottom coating layer is grown above the waveguide layer 3 as well. In the active region, the mask 16 composed of oxide prevents the over-growing with the semiconductor material of the lower cover layer 10. FIG. 5 shows the layer structure after this lower cover layer 10 has been grown on and a first contact layer 17 (e.g. $n^+$-doped InGaAs:Si), which improves the contacts with metallizations to be applied later. The buffer layer 2, which is laterally partially etched-off, is located on the substrate 1. In the ridge or strip, the waveguide layer 3, the intermediate layer 4, the active layer 5, the grid layer 6, and the strip-shaped mask 16 composed of oxide are provided. The longitudinal cross-section which is provided is shown in FIG. 6. In the passive region, the lower cover layer 10 is directly located on the waveguide layer 3, and thereupon the first contact layer 17. The cross-section in the passive region provided here is shown in FIG. 7. On the substrate 1, a buffer layer 2 is shown which is laterally etched off more here, and on the central ridge or strip thereof the waveguide layer 3 as a passive optical waveguide is shown. The lower cover layer 10 is grown on over the entire surface, i.e. also on this ridge or strip. Located thereupon is the first contact layer 17.

Figure 8:
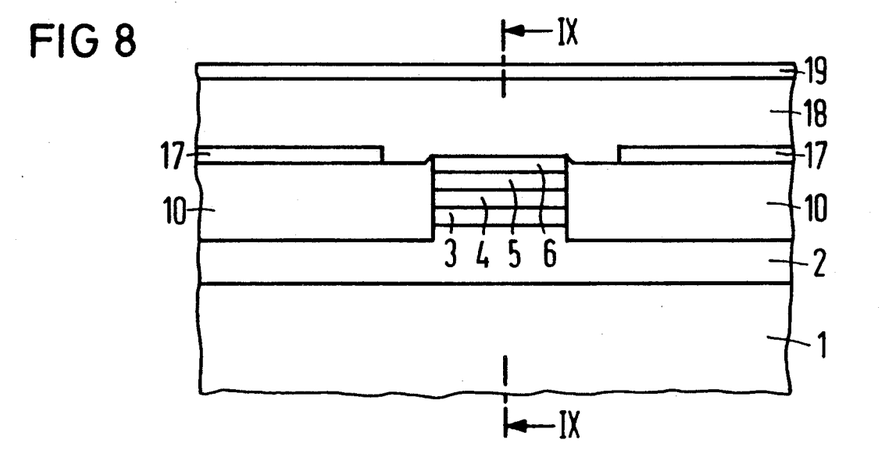
Figure 9:
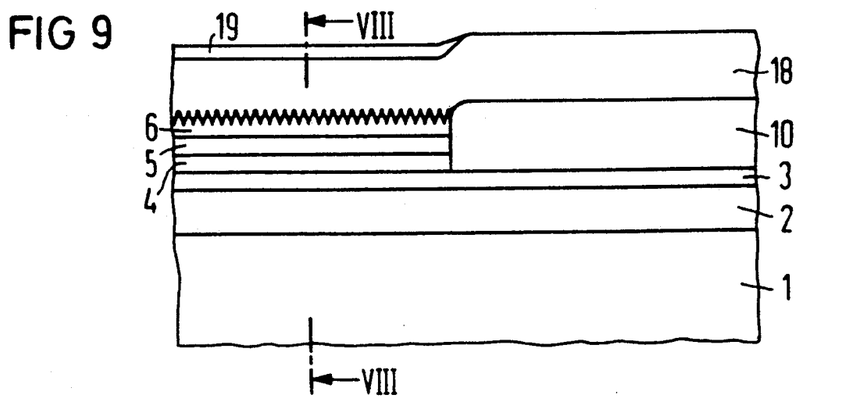

The first contact layer 17 is subsequently removed in the passive region and at two narrow strips on both sides of the mask 16. After that, the mask 16 is removed. In a last epitaxial step, the upper coating layer 18 (e.g. composed of p-doped InP:Zn) is applied over the entire surface. This upper coating layer 18 must differ in its refractive index from the grating layer 6, since it grows over the grating and thus contributes to the periodic variation of the refractive index. On the upper coating layer 18 a second contact layer 19 (e.g. $p^+$-doped InGaAs:Zn) is applied which serves for the improvement of the contact of a metallization to be applied thereon. This second contact layer 19 is subsequently removed in the passive region. The longitudinal cross-section shown in FIG. 8 is shown in FIG. 9. In the active region, the upper coating layer 18 is applied on the grating layer 6 and in the passive region on the lower coating layer 10. In the active region, the second contact layer 19 is located on the upper coating layer 18.

Above the strip of the active layer 5, the second contact layer 19 is structured to form a strip, which is slightly wider than the active strip 5. The central contact layer 8 remaining from the second contact layer 19 and the sides thereof are covered with oxide. Subsequently, this oxide and the upper coating layer 18 are etched down with a selective method to the lateral contact layer 11. Above the strip of the active layer 5 a ridge or strip of the upper cover layer 7 thereafter remains, which is slightly wider than the gap in the portions of the lateral contact layer 11, and slightly wider than the strip of the central contact layer 8 applied on this upper cover layer 7.

Figure 10:
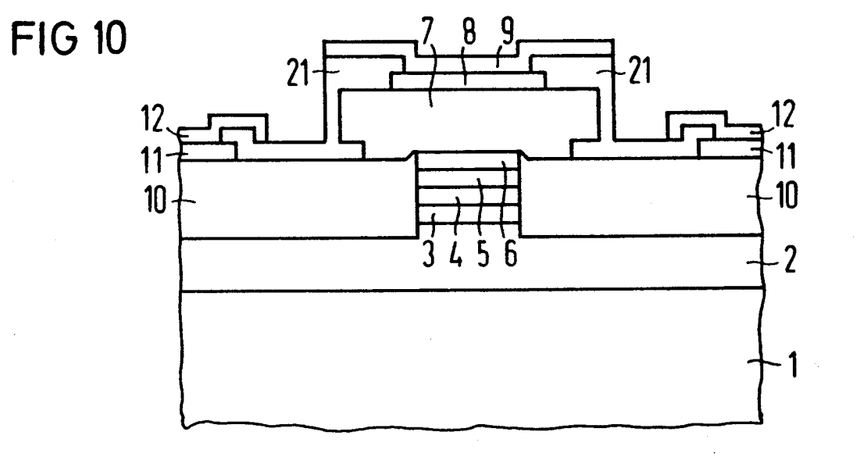
FIGS. 10 and 26 show two embodiments of the laser-diode-waveguide combination of the invention in cross-section; and The remaining

The lateral contact layer 11 is likewise etched in strip-shaped fashion whereby its portions are etched out under the sides of the upper cover layer 7, so that between the upper cover layer 7 and the remaining portions of the lateral contact layer 11, the surface of the lower cover layer 10 is exposed in narrow strips. The entire surface is covered with a dielectric material 21 (insulation oxide) which is removed again above the strips of the central contact layer 8 and the lateral contact layer 11. Finally, a contact metallization is evaporated on, which is brought in a suitable form in a last photolithography step, so that a central contact 9 is established on the central contact layer 8 and, electrically insulated therefrom, and a lateral contact 12 is established on the lateral contact layer 11. In the present exemplary embodiment, the central contact 9 is the p-contact, and the two-part lateral contact 12 on the two-part lateral contact layer 11 is the n-contact. A cross-section through the finished active region of this exemplary embodiment is shown by FIG. 10.

A further exemplary embodiment with a buried rib-waveguide is described in the following. This exemplary embodiment is also based on the structure according to FIG. 2 or FIG. 3. The waveguide layer 30, however, here has only the function of an etching-stop layer. It can therefore be thinner than in the preceding exemplary embodiment. In the passive region, the layer sequence is removed, including the waveguide layer 30.

Figure 11:
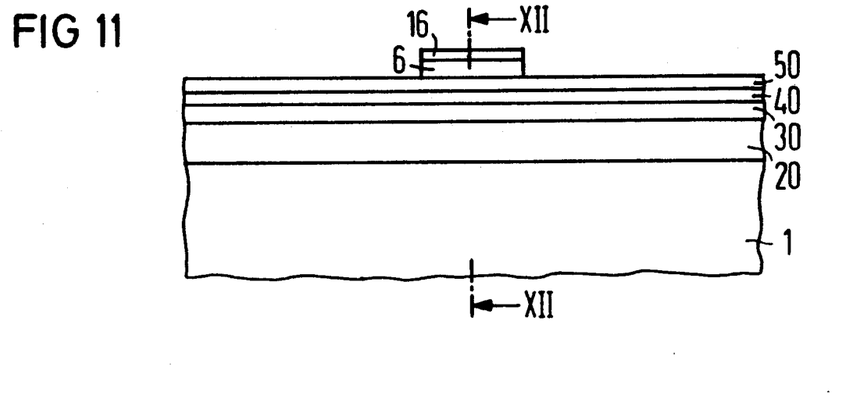
Figure 12:
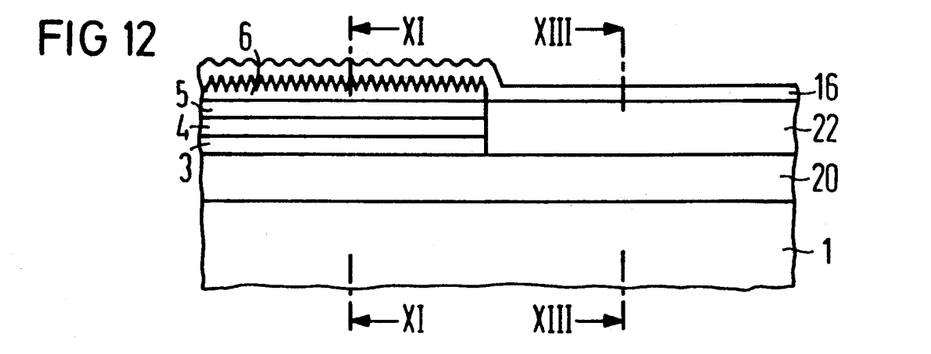
Figure 13:
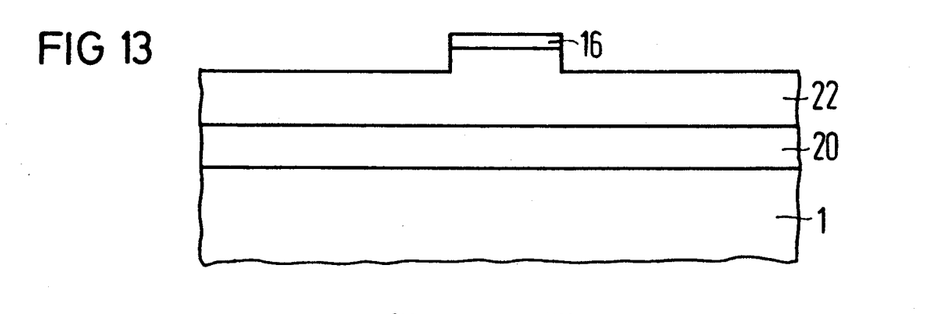
Figure 14:
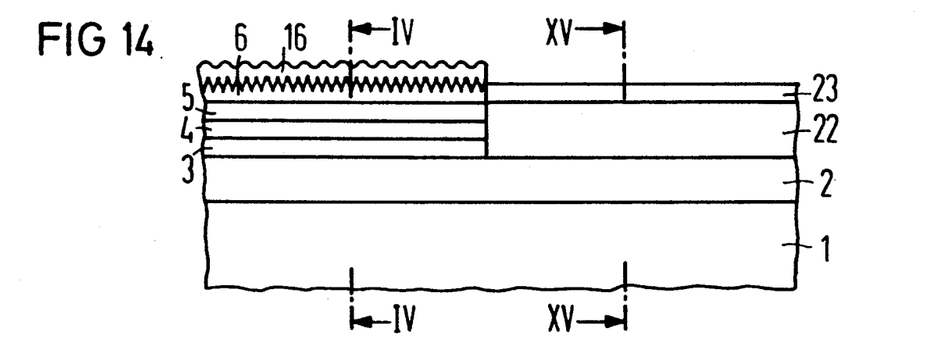
Figure 15:
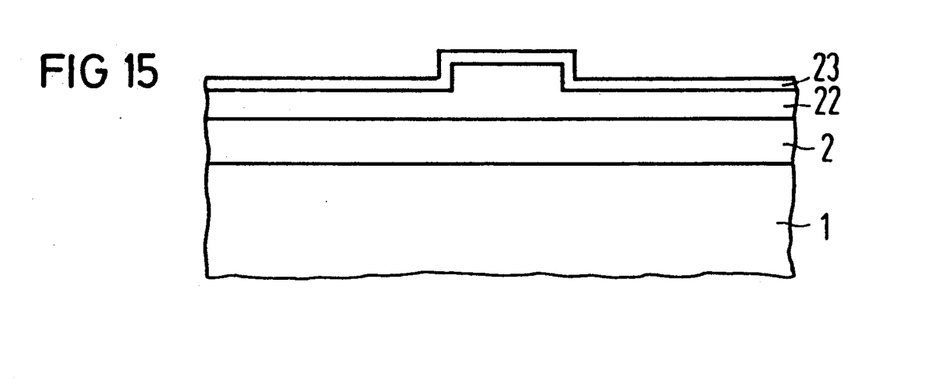

Subsequently, an undoped waveguide layer 22 (e.g. InGaAsP of the wavelength 1.05 μm) is grown on in epitaxial fashion in the passive region in which the surface of the buffer layer 20, or respectively if no buffer layer exists, the substrate is exposed. Thereby, the active region is covered by an oxide ($SiO_2$) preventing the epitaxial growth there. After the waveguide layer 22 has been grown on, this one is covered with oxide as well, which is structured to form a narrow strip across the entire length. This oxide strip serves as mask 16 for the etching of the rib in the waveguide. Simultaneously, it defines the laser ridge or strip, which is etched in the following step. FIG. 11 shows a cross-section in the active region with the mask 16 and the grid layer 6 etched in strip-shaped fashion on the overall active layer 50. The shown longitudinal cross-section is illustrated in FIG. 12. The waveguide layer 22 follows the layer sequence composed of waveguide layer 3 (etching stop layer), intermediate layer 4, active layer 5, and grid layer 6. The illustrated cross-section in the passive region is shown in FIG. 13. In the passive region a ridge or strip (rib waveguide) is etched in the waveguide layer 22 by means of the mask 16. After the etching of this rib, the mask 16 is removed in the passive region. In this region, another mask 23 (oxide, e.g. $Al_2O_3$) is applied. The material of this other mask 23 must be able to be etched selectively against the material of the first mask 16. The mask 23 protects the waveguide rib when the laser ridge or strip is etched. The respective structure is shown in the FIGS. 14 and 15. The cross-section in the passive region shown in FIG. 14 is shown in FIG. 15 with the other mask 23 applied over the entire surface there. The cross-section in the active region shown in FIG. 14 corresponds to FIG. 4 of the preceding exemplary embodiment.

Figure 16:
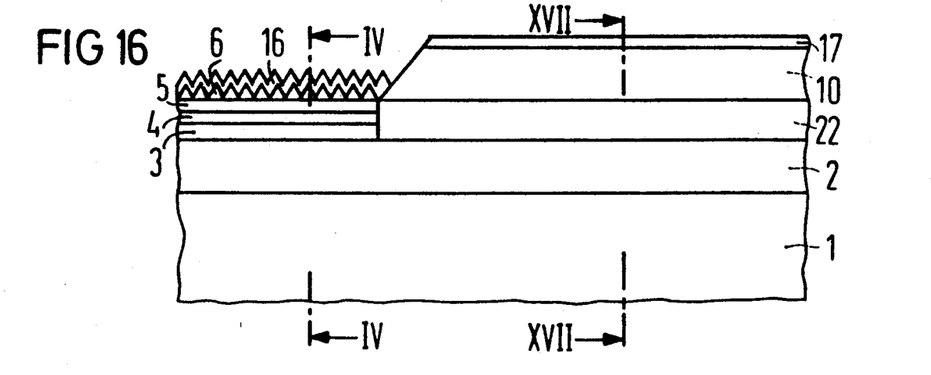
Figure 17:
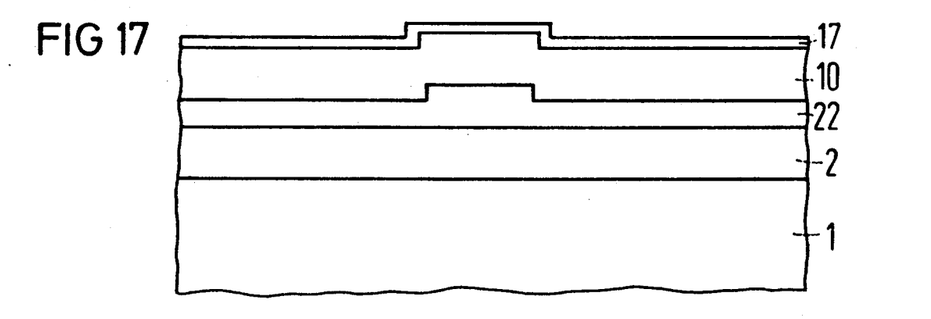

The other mask 23 is removed and the lower coating layer 10 as well as the first contact layer 17 are grown on epitaxially. The mask 16 that remained on the laser ridge or strip thereby prevents the epitaxial growth of these layers on the laser ridge or strip. FIG. 16 shows a longitudinal cross-section corresponding to FIG. 6 of the first exemplary embodiment. The illustrated cross-section in the active region again corresponds to FIG. 4 of the first exemplary embodiment. The illustrated cross-section in the passive region is shown in FIG. 17. In FIG. 17, above the waveguide layer 22 with the rib etched out therein, the lower cover layer 10 and thereupon the first contact layer 17 is grown over the entire surface. As in the first exemplary embodiment, the first contact layer 17 is removed in the passive region and in small strips on both sides of the mask 16. After that, the mask 16 is likewise removed. The upper coating layer 18 and the second contact layer 19 are grown over the entire surface. Subsequently, as in the first exemplary embodiment, these layers are etched down to the upper cover layer 7, the central contact layer 8, and the lateral contact layer 11. The dielectric material 21 and the central contact 9 as well as the lateral contact 12 are applied, as in the first exemplary embodiment. The active region does not differ from that of the first exemplary embodiment, whereas in the passive region in this second exemplary embodiment the waveguide is not designed as an extension of the waveguide layer 3, but as a rib waveguide in the waveguide layer 22.

The inventive laser-diode-waveguide combination can also integrate the TTG-DFB laser diode described in the last publication in IEE Proceedings 137, 69–73, cited as prior art. This laser diode has an electronically controllable waveguide above or under the active layer. In the following, the manufacturing of an exemplary embodiment is described whereby this adjustment or tuning layer lies under the active layer and continues as a passive waveguide outside of the laser area, i.e. in the passive region. Therefore, the manufacturing of this exemplary embodiment is similar in many ways to that of the first exemplary embodiment. Other waveguide types, as e.g. the rib waveguide of the second exemplary embodiment can likewise be integrated with this TTG-DFB laser diode to the inventive combination. In the case of the rib waveguide, the manufacturing method requires changes corresponding to the second exemplary embodiment.

Figure 18:
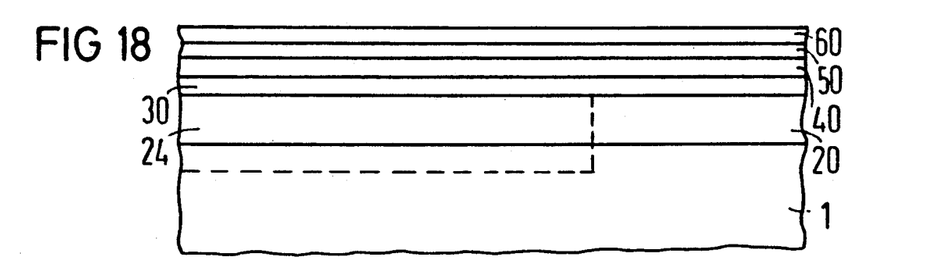
Figure 19:
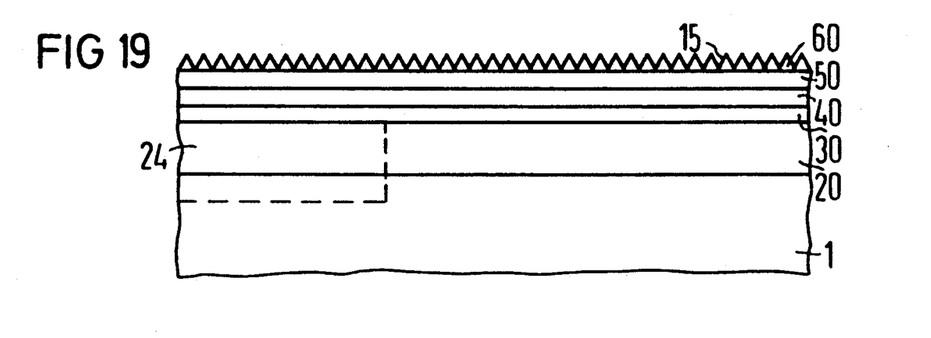

The following is a description of the combination of the TTG-DFB laser diode and the waveguide of the first exemplary embodiment, as a further exemplary embodiment. For the current supply in an adjustment layer, an additional doping is necessary. Advantageously, this doping occurs before the rest of the layer sequence is grown on the buffer layer 20 grown on the substrate 1, or if no buffer layer 20 is grown, directly on the substrate 1. The sign of the doping is the same as that of the upper coating layer, in the present exemplary embodiment p-type. Then, the waveguide layer 30 as an adjustment layer, the intermediate layer 40, the active layer 50, and the grid layer 60 are grown on. FIG. 18 shows this layer sequence in cross-section and the doped area 24 is shown with dashed lines. The implantation or diffusion of doping material is locally limited, i.e. the doped area 24 is located below the area to be taken up by the laser strip and on one side thereof. The other side remains undoped. FIG. 19 shows a longitudinal cut with the grid 15 generated in the grating layer 60. The doped region 24 is limited to the active region.

Figure 20:
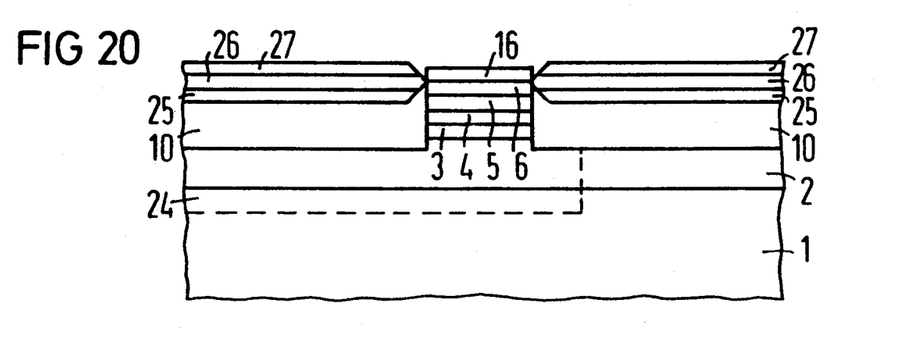
Figure 21:
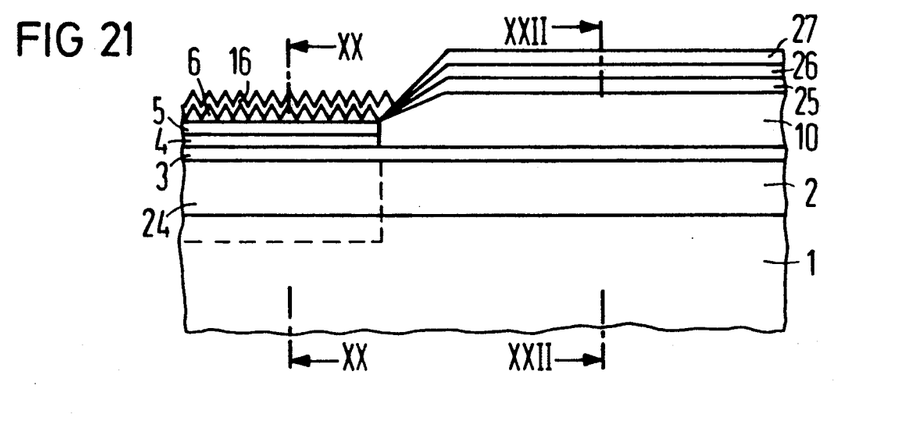
Figure 22:
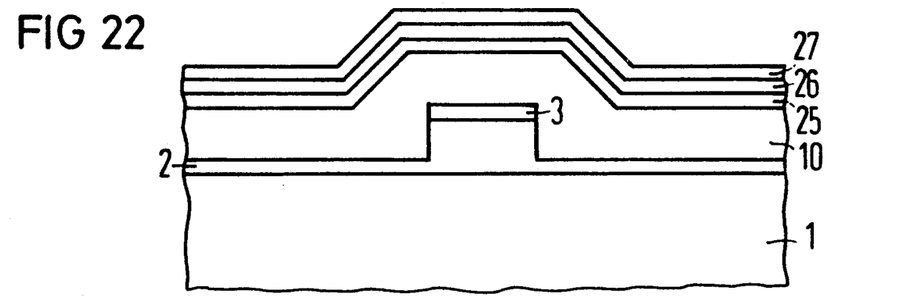
Figure 23:
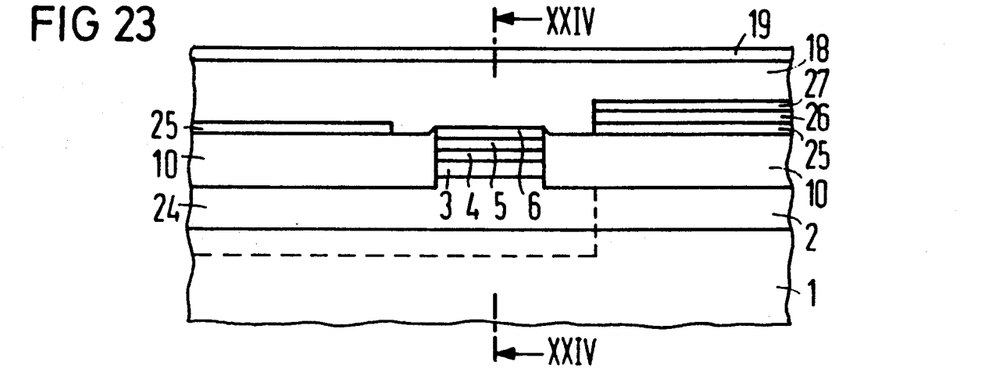

As in the first exemplary embodiment, the grating layer 60, the active layer 50, and the intermediate layer 40 are removed in the passive region, and the layer sequence in the active region is etched back to the laser ridge or strip shown in cross-section in FIG. 4, whereby again a mask 16 is used. Then, the lower cover layer 10 corresponding to FIG. 5 and FIG. 6 is grown on. In this exemplary embodiment, the first contact layer will advantageously be composed of a three-part layer sequence. A first partial-contact layer 25 is doped low, in this exemplary embodiment, of n-type. Following thereupon is a second partial-contact layer 26 of a different composition (e.g. InP:Zn), and thereupon a third partial contact layer 27, which is doped high. The first and the third partial contact layers 25, 27 can consist of the same material, but the materials can also be different, as specified in the cited reference (first partial contact layer 25 e.g. n-InGaAsP, second partial contact layer 26 n-InP, third partial contact layer 27 $n^+$-InGaAs). FIG. 20 shows the cross-section in the area of the laser diode with the substrate 1, the buffer layer 2, the doped region 24, the waveguide layer 3 as an adjustment layer, the intermediate layer 4, the active layer 5, the grating layer 6, the mask 16, the lower cover layer 10, and the three partial contact layers 25, 26, 27. A longitudinal cross-section is shown by FIG. 21 and a cross-section in the passive region by FIG. 22.

Figure 24:
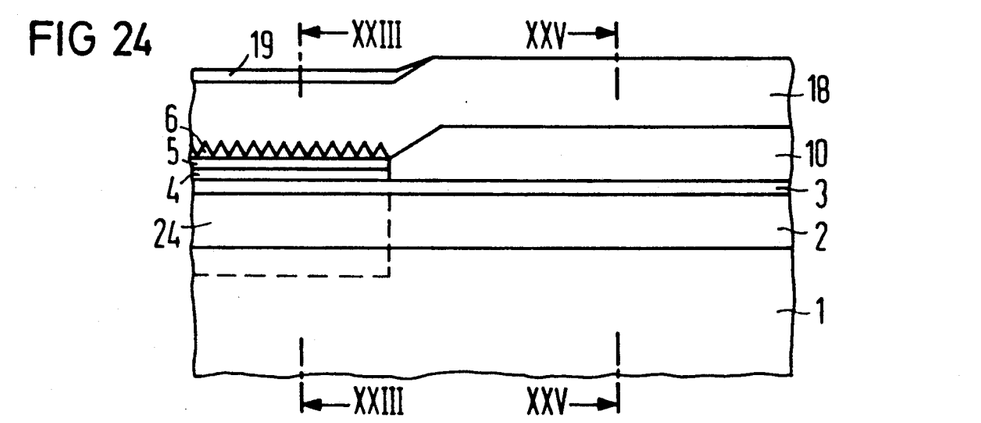
Figure 25:
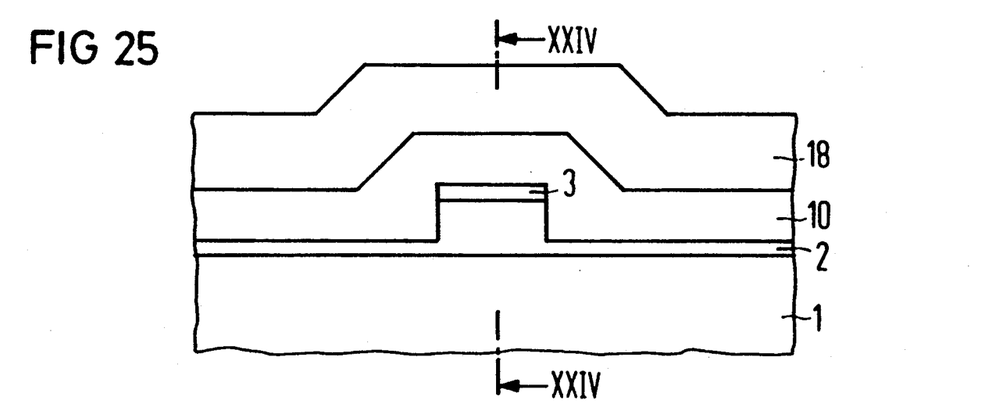

The mask 16 is removed and the first contact layer is etched to strip-shaped areas in the active region. Additionally, the portions of the second and third partial contact layers 26, 27 are removed on the side of the doped region 24, so that in this area only the respective portion of the first partial contact layer 25 remains. Then, the upper coating layer 18 and the second contact layer 19 are grown on. The longitudinal cross-section after this manufacturing step is shown by FIG. 24. FIG. 25 shows the cross-section in the passive region.

Figure 26:
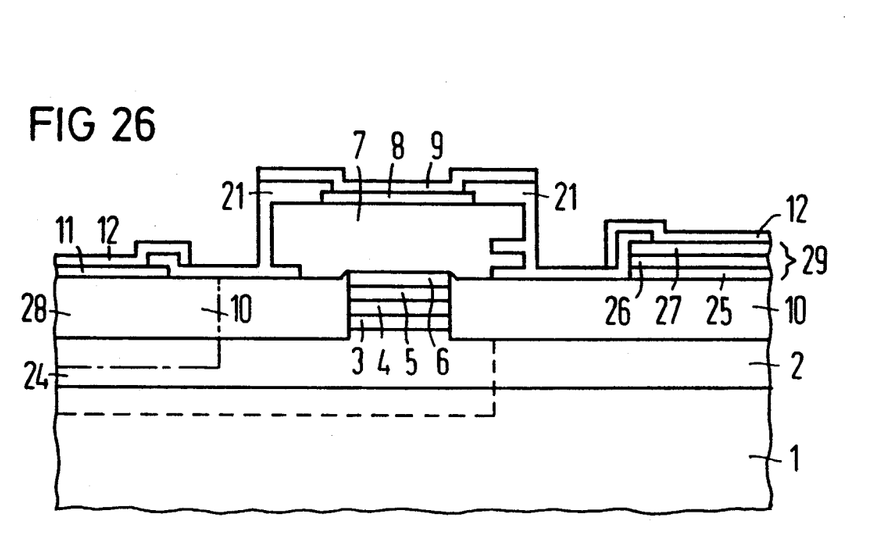

After the upper cover layer 7 has been etched down to the strip corresponding to the first exemplary embodiment, the surfaces of the lateral contact layers 11, 29 are exposed. On the side located above the doped area 24 this lateral contact layer 11 is only composed of the respective portion of the first partial contact layer 25. On the other side, the lateral contact layer 29 is composed of three layer portions 25, 26, 27. The portion of the lateral contact layer 11 above the doped area 24 and the portion of the lower cover layer 10 located therebelow are redoped by implantation or diffusion with doping material, so that the semiconductor material has the same conductivity as the doped area 24 below. On the lateral contact layer 11, a lateral contact 12 is applied. Via this lateral contact 12 it is possible on the side of the three-layered lateral contact layer 29 to supply current via the central layer 4 for the activation of the active layer 5 and the waveguide layer 3. The second contact for the active layer 5 is located as a central contact 9 on the central contact layer 8. The second contact for the waveguide layer 3 as an adjustment layer is formed by the other part of the lateral contact 12 on the lateral contact layer on the second doped region 28. The current supply occurs via this second doped region 28 in the lower cover layer 10 and the initially generated doped areas 24 in the buffer layer 2, as shown in FIG. 26 in cross-section. Otherwise, the structure corresponds to the exemplary embodiment according to FIG. 1.

The inventive laser diode waveguide combination enables the monolithic integration of a laser diode with a waveguide on a semi-insulating substrate, whereby various embodiments, particularly adjustable laser diodes, are possible for the laser diode. The bonding surfaces of the contacts are located on the surface of this laser diode waveguide combination, and the inventive structure can be manufactured in simple fashion.

Although various minor changes and modifications might be proposed by those skilled in the art, it will be understood that I wish to include within the claims of the patent warranted hereon all such changes and modifications as reasonably come within my contribution to the art.

I claim as my invention:

1. A monolithically integrated laser diode waveguide system, comprising:
   a semi-insulating substrate;
   a passive waveguide layer coupled with a strip-shaped laser diode active layer adjacent a main surface of the substrate;
   a strip-shaped upper cover layer of first conductivity type at a side of the active layer not facing the substrate, and a central contact layer applied on the cover layer;
   a strip-shaped intermediate layer of second conductivity type at a side of the active layer facing the substrate and which is defined by two main surfaces parallel to the main surface of the substrate and two longitudinal sides and two narrow end sides;
   a lower cover layer bordering the two longitudinal sides of the intermediate layer at a region of the laser diode and which is doped as a second conductivity type at least at one longitudinal side of the intermediate layer;
   a lateral contact layer applied on said lower cover layer;
   a central contact applied on the central contact layer and a lateral contact applied on the lateral contact layer;
   the lower cover layer being doped on one side of the intermediate layer as first conductivity type;
   a tuning layer at a surface of the intermediate layer facing the substrate;
   a region doped of the first conductivity type and bordering a main side of the adjustment layer facing the substrate and which is connected with a portion of the lower cover layer which is doped as first conductivity type;
   the lateral contact layer having a first portion on a first portion of the lower cover layer doped as first conductivity type, and a second portion separated therefrom on a second portion of the lower cover layer doped as the second conductivity type; and
   the separated first and second portions of the lateral contact layer each being provided with a separate lateral contact.

2. A laser diode waveguide system according to claim 1 including a DFB grating means in a grating layer arranged between the upper cover layer and the active layer for optical feedback of laser light of the laser diode.

3. A laser diode waveguide system according to claim 1 including a DFB grating means between the intermediate layer and the substrate for optical feedback of laser light.

4. A laser diode waveguide system according to claim 1 wherein the first and second portions of the lateral contact layer which are applied on the respective first and second portions of the lower cover layer have different material compositions at least in respective uppermost layer portions provided with the respective lateral contacts.

5. A laser diode according to claim 1 wherein
   the first conductivity type is p-type and the second conductivity type is n-type, and
   at least one layer portion of the central contact layer bordering the central contact is doped p+-conductive and at least one layer portion of the lateral contact layer bordering the lateral contact provided for an n-conductive doped portion of the lower cover layer is doped n+-conductive.

6. A monolithically integrated laser diode waveguide system, comprising:
   a semi-insulating substrate;
   a passive waveguide layer coupled with a strip-shaped laser diode active layer adjacent a main surface of the substrate;
   a strip-shaped upper cover layer at a side of the active layer not facing the substrate, and a central contact layer applied on the cover layer;
   a strip-shaped intermediate layer at a side of the active layer facing the substrate and which is defined by two longitudinal sides;
   a lower cover layer adjacent the two longitudinal sides of the intermediate layer at a region of the laser diode;
   a lateral contact layer applied on said lower cover layer;

a central contact applied on the central contact layer and a lateral contact applied on the lateral contact layer;

the lower cover layer being doped on one side of the intermediate layer as first conductivity type;

a tuning layer at a surface of the intermediate layer facing the substrate;

a region doped of the first conductivity type and bordering a main side of the adjustment layer facing the substrate and which is connected with a portion of the lower cover layer which is doped as first conductivity type;

the lateral contact layer having a first portion on a first portion of the lower cover layer doped as first conductivity type, and a second portion separated therefrom on a second portion of the lower cover layer doped as the second conductivity type; and the separated first and second portions of the lateral contact layer each being provided with a separate lateral contact.

* * * * *